United States Patent [19]

Haddick

[11] Patent Number: 5,283,108
[45] Date of Patent: Feb. 1, 1994

[54] PROCESS FOR PRODUCING DEFECT FREE MULTILAYER PRINTED CIRCUIT BOARDS

[75] Inventor: Glenn T. Haddick, Redwood City, Calif.

[73] Assignee: Hewlett-Packard Company, Palo Alto, Calif.

[21] Appl. No.: 976,132

[22] Filed: Nov. 12, 1992

[51] Int. Cl.$^5$ .................................................. B32B 9/00
[52] U.S. Cl. ........................................ 428/209; 428/901; 428/457; 156/306.9; 156/331.4
[58] Field of Search .................. 523/139; 156/901–902, 156/331.4, 325, 326, 308; 428/209, 901, 457, 458

[56] References Cited

U.S. PATENT DOCUMENTS 4,287,014  9/1981  Gaky ................................ 428/901
5,132,778  7/1992  Juskey .............................. 523/139

OTHER PUBLICATIONS

Coombs, "Printed Circuits Handbook"; 3rd Ed., McGraw Hill, 1988 pp. 34.11–34.18.

Primary Examiner—Patrick J. Ryan
Assistant Examiner—Patrick R. Jewik

[57] ABSTRACT

A process for producing defect free multilayer printed circuit boards using low pressure lamination with a cyanate ester laminate. Alternate layers of cyanate ester core and prepreg materials are stacked and at least partially cured under pressure and elevated temperatures to produce a multilayer laminated printed circuit board. The use of a low pressure cure avoids the storage of stress within the laminate. Such stress would otherwise produce microcracking and/or delamination of the circuit board when the stress is released during the subsequent thermal cycling or exposure to caustics attendant with working and reworking of the printed circuit board.

10 Claims, 3 Drawing Sheets

PROCESS FOR PRODUCING DEFECT FREE MULTILAYER PRINTED CIRCUIT BOARDS

BACKGROUND OF THE INVENTION

1. Technical Field

The present invention relates to multilayer printed circuit boards. More particularly, the present invention relates to the use of cyanate ester laminates to produce multilayer printed circuit boards.

2. Description of the Prior Art

Multilayer printed circuit boards are manufactured from various resins, which are mixed with solvents and other chemicals, and then coated onto a glass fabric. The resulting board material is available in a partially cured form, referred to 'prepreg', and in a cured form, usually having a metal coating on one or both sides, and which is referred to as a 'core'.

The cores are patterned, typically using an image etch process, to produce an electrical interconnect on the metal coated surface of each core. The patterned cores, each of which makes up one or two layers of a multilayer printed circuit board, are then stacked. One or more layers of prepreg material are placed between each core in the stack. The stacked materials are then cured to form a multilayer laminate.

The curing process involves the application of heat and pressure using various techniques: for example, press molding, with or without vacuum assist; and autoclave molding, with or without vacuum bags. The FR-4 materials are laminated over a very wide range of pressures, e.g. 25–450 psi, based on economic convenience, but more typically in the 200–350 psi range. Manufacturers may adjust the heat rise and pressure to affect cycle times in a variety of beneficial ways. The laminating temperature varies according to the degree of cure needed to produce physical and mechanical properties required for the end product. A typical temperature of 180° C. is produced by gradually raising the temperature, holding the temperature constant for a period of time, and then lowering the temperature to room temperature.

After curing, the boards are drilled, imaged and plated to electrically connect surface and internal conductive layers, and components are mounted to the board, by wave soldering or surface mount techniques.

Of the various resins available, FR-4, has been the most commonly used and widely accepted material for making printing circuit boards. Other resins that are in use in the printed circuit board industry include polyimides, BT epoxy, and cyanate esters, among yet others. Polyimides, due to their high cost, have found limited acceptance; while BT epoxy is difficult to process and therefore expensive.

Cyanate esters have several advantages over both FR-4 and polyimides and are therefore an attractive alternative to these and other materials. Cyanate esters are less expensive than polyimides; they are better suited for thick multilayer structures than FR-4 because they have a low thermal coefficient of expansion; and they are better suited for high frequency applications than FR-4 because they have a lower dielectric constant and low loss factors. Thus, in high frequency applications, e.g. 50–100 MHz, printed circuit boards made of FR-4 require special design considerations, including component placement, and load calculations to take into account the RF characteristics of the board. Additionally, it is very difficult to make thick boards of FR-4 because the vias used to interconnect the various layers of a multilayer FR-4 printed circuit board are subjected to considerable stress due to expansion of the board under conditions of thermal cycling, such that the vias often fail.

Cyanate ester resins, such as Arocy B-40S, are available from chemical manufacturers, such as Ciba Geigy of Switzerland, among others; cores and prepreg materials made from cyanate ester resins, such as N8000, are available from laminators, such as Nelco of Fullerton, Calif., among others.

One of the major drawbacks of cyanate ester printed circuit board laminates has been the tendency of such laminates to form microcracks during normal (i.e. FR-4 type) board fabrication processes. Microcracks form around the drilled holes in a printed circuit board and sometimes on the laminate surface when the cyanate ester material comes into contact with caustic solutions as are typically used in processing printed circuit boards. Such caustic solutions are used for a variety of purposes, e.g. electroless Cu plating, image resist development, and de-smearing of drilled holes.

These microcracks can cause long term electrical reliability problems on finished assemblies in products. For example, the cracks allow electrolytes to accumulate within the board material which, in time, may grow dendrites that become metal connections, and, that ultimately create short circuits. This process is referred to as anodic cathodic filamentosis. It is important to note that the cracks form in the cyanate ester polymer resin in pure and alloyed forms of the material (this includes catalysts, flame retardants, and solvents), with and without glass reinforcement.

SUMMARY OF THE INVENTION

The present invention provides a process for producing defect free multilayer printed circuit boards using low pressure lamination with cyanate ester laminates.

In the preferred embodiment of the invention, a multilayer printed circuit board is provided in which alternating layers of cyanate ester core material and cyanate ester prepreg material are stacked and laminated in a press. The invention teaches curing the laminate in the presence of heat at standard processing temperatures, e.g. 180° C. Curing pressure, contrary to conventional teaching, is less than 156 psi and is, preferably, about 75 psi. The lamination process produces an incomplete cure and the laminate is therefore subjected to a post bake step at about 220° C., in the absence of pressure, to complete the cure.

DETAILED DESCRIPTION OF THE INVENTION

Figure 1:
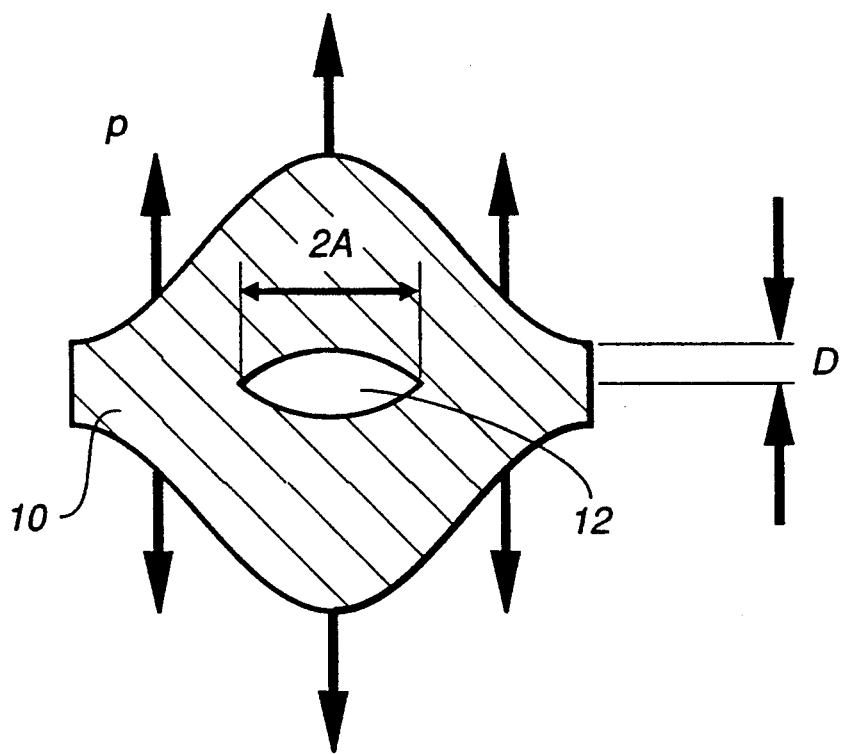
FIG. 1 is a schematic cross sectional view of a laminate which is shown as part of a delamination model.

The present invention is best understood by referring to the Drawings in connection with review of this Description. The present invention provides a process for producing defect free multilayer printed circuit boards using low pressure lamination with cyanate ester laminates.

In accordance with the present invention, a failure analysis, fracture mechanics model involving crack lengths, layer thicknesses and measured fracture toughness of the resins and laminates was used to develop a low pressure lamination technique as a means of limiting and preventing delamination of cyanate ester printed circuit board materials.

The delamination model applied is shown in schematic cross section format in FIG. 1. In the Fig., a laminate 10, is shown having a void 12 produced by the laminate's reaction to the environment which released some of the original lamination pressure. The model shown is used to calculate the amount of pressure or energy released in forming the void, according to the formula:

$$P^2 = \frac{3*G*E*D^3}{4A^4} \quad (1)$$

where:
P = pressure released (indicated by P in FIG. 1);
D = the width of the void 12 (microcrack) produced in the laminate 10 by the release of pressure P (indicated by D in FIG. 1);
A = the length of the void 12 (microcrack) produced in the laminate 10 by release of pressure P (indicated by A in FIG. 1);
E = 0.46 * $10^6$ psi (Young's modulus, i.e. a tension constant, expressed as stress vs. strain); and
G = 0.8 in-lb/$in^2$ (fracture toughness).

The above formula (1) may be applied to commonly available core and prepreg materials, for example, as follows:

| Glass Style | D | A | P |
|---|---|---|---|
| 1080 | 2.5 mils | 13 mils | 385 psi |
| 7628 | 3.5 mils | 17.6 mils | 350 psi |

Voids were encountered during a solder float test, in which a printed circuit board is floated on a bed of molten solder (about 250° C.) to determine if the board is able to withstand the actual thermal cycling to which the board is subjected during the repeated heating and cooling associated with working and reworking a printed circuit board.

The present invention teaches the use of a low pressure cyanate ester lamination process to limit the amount of energy stored in the laminate material structure that may subsequently be released during interaction with the environment, such as during thermal cycling or exposure to caustics, and which results in the various failures discussed above, e.g. delamination and microcracking. It is thought that this energy is stored in cyanate ester laminates as a result of the high pressure applied to the laminate during the curing process. Energy release accompanies thermal cycling and/or caustic chemical interaction.

Figure 2:
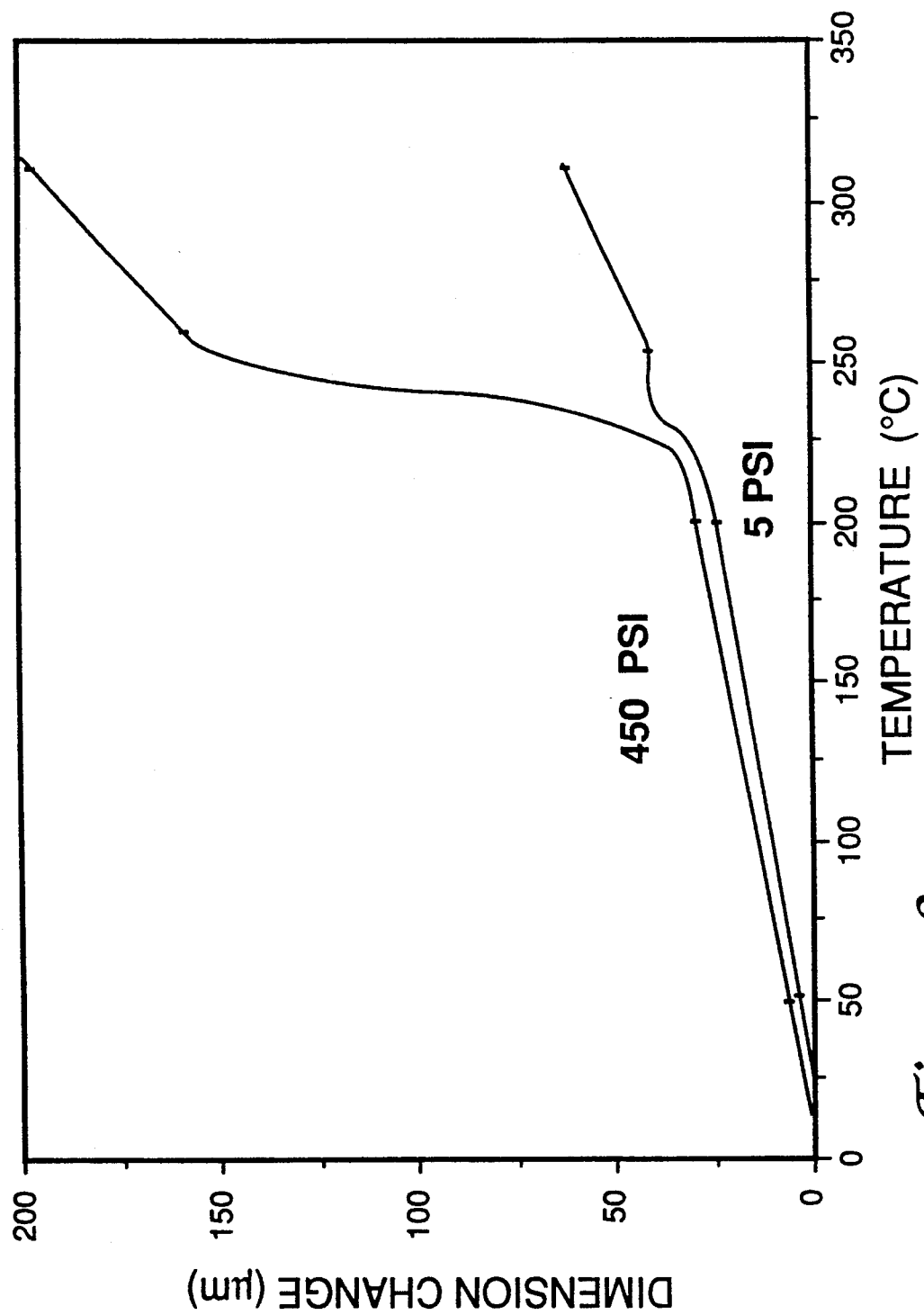
FIG. 2 is a graph plotting dimension change vs. temperature to show the effect of molding pressure on thermal mechanical analysis of N-8000 resin castings.

A stored energy release was observed in a thermal mechanical analysis (TMA) test of raw resin castings initially cured to 85% conversion and which was post baked at 450 psi, as shown in FIG. 2. In the Fig. it can be seen that a resin casting cured and post baked at room pressure and labeled 5 psi (low pressure cure) was subjected to thermal cycling and dimension change was noted. A resin casting that was post baked at 450 psi (high pressure) was also subjected to thermal cycling and dimension change was noted. The vast difference in dimensional change between the low pressure post bake and the high pressure post bake is the result of the release of pressure stored in the high pressure post bake during the cure process.

Thus, the amount of pressure released under conditions of thermal cycling or exposure to caustics should be brought as close to zero as possible. This principle can be thought of in terms of reducing the initial pressure applied and stored during the curing process to an amount equal to the amount of pressure released during thermal cycling or exposure to caustics after cure. By avoiding the release of pressure during thermal cycling or exposure to caustics after cure, the inventor has discovered that the failure mechanisms in multilayer cyanate ester printed circuit boards, described above, are avoided.

Material failures included:
delamination of the resin during time-temperature profiles common to printed circuit board assembly and rework processes;
microcracking caused by mechanically drilling the holes in the printed circuit boards (which was observed after the outer layer Cu was etched away); and
microcracks formed in the holes and on the board surface after contact with high pH solutions (caustics) common to printed circuit board fabrication processes.

The low pressure lamination process of the present invention produces significant reductions and, in some cases elimination of, the formation of microcracks, as set forth above, on cyanate ester printed circuit boards processed through standard FR-4 processes.

EXAMPLE

The factorial design of the experiment was as follows:

| FACTORS | LEVELS | |
|---|---|---|
|  | − | + |
| Lamination Pressure (psi) | 75 | 450 |
| Lamination Heat Rise (C/min) | 8 | 24 |
| Exposure To Caustics (min) | 10 | 20 |

Test Vehicle. A 3"×3" board used for testing. The board was cut into four equal sized pieces containing from 160 to 200 holes each. Each piece contained an approximately consistent number of holes from the different hole sizes that were used to drill the boards (e.g. 0.016", 0.025", and 0.035" diameters). A typical arrangement was 100–16 mil holes; 50–25 mils holes; and 50–35 mil holes. No attempt was made to separate the frequency of cracks with hole size in this test. Therefore, the percentage of holes with cracks was used to analyze the results.

Caustic Soak. The caustic bath used was a 13 pH mixture of NaOH in water which was heated to 70° C. Coupons were suspended in the bath for 10 minutes, followed by rinsing in ultrasonic agitated DI water. Cracks were labeled on each coupon, and then the same coupons were returned to the caustic bath for another 10 minutes of exposure. Again, cracks were counted by keeping track of holes that had previously been cracked by the first 10 minute exposure. Two replications of each pressure and heat rise variation were tested to obtain a reasonable estimate of experimental error. Cracks were observed with a lighted 10× viewer which is capable of resolving a 2 mil (0.05 mm) crack. Only the number of holes with cracks was used in this analysis. No distinction was made for holes with more than one crack.

Results. The results are presented in the following table:

| Lamination | | Replication No. 1 Caustic Time | | | Replication No. 2 Caustic Time | | |
|---|---|---|---|---|---|---|---|
| Pressure | Heat Rise | Holes/ board | 10 min. | 20 min. | Holes/ board | 10 min. | 20 min. |
| 75 | 8 | 160 | 0 | 0 | 200 | 4 | 13 |
| 450 | 8 | 200 | 37 | 56 | 170 | 53 | 70 |
| 75 | 24 | 160 | 0 | 1 | 200 | 1 | 1 |
| 450 | 24 | 170 | 45 | 72 | 200 | 35 | 60 |

When these results were recalculated in the form of the percentage of cracked holes and placed into a Yates algorithm, the only statistical response was found to be lamination pressure. Increasing the lamination pressure from 75 psi (5 bar) to 450 psi (30 bar) produced an increase in cracked holes of 26.8%. All other factors were in the noise of the experiment, which was 8.0%. It was also observed that the exposure time factor was 8.0%. Although the exposure time factor did have a noticeable effect on the 450 psi material, the value was considered to be in the noise level and thus not statistically valid.

The average effect for 75 psi lamination was 1.3% cracked holes; while the average effect for 450 psi material was 28.1% cracked holes. The difference between the 10 minute and 20 minute exposure times was significant for the 450 psi laminated material, where 20 minutes exposure produced an increase in cracked holes of 14.6%. The difference in exposure time on the 75 psi material only produced a 1.3% increase in cracked holes, which was more than an order of magnitude decrease from the 450 psi material.

It has been found that the curing mechanism for cyanate esters is such that curing under low pressure in accordance with the present invention results in a cure of about 85% conversion. Curing is completed by a post bake procedure, in which the laminate is baked at about 220° C. for about 5 hours in the absence of pressure.

Figure 3:
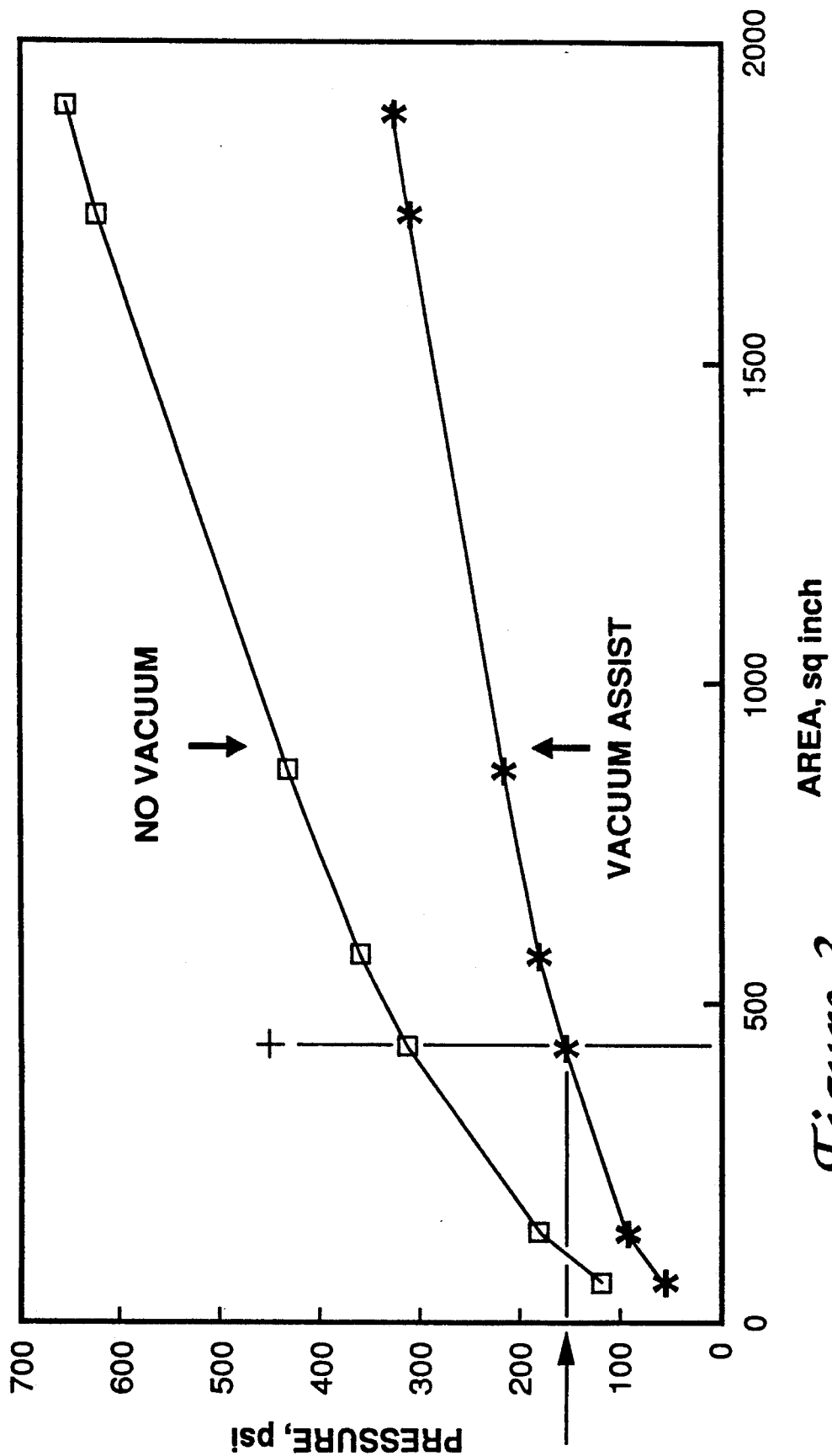
FIG. 3 is a graph plotting lamination pressure vs. laminate area for FR-4 vacuum assisted and unassisted processes.

Typical printed circuit board lamination pressures for FR-4 for vacuum assisted and non-vacuum assisted processes are shown in FIG. 3. The Fig. plots a vacuum assisted process for an 18 by 24 inch printed circuit board laminated at 450 psi, 350 psi, and 75 psi. The latter pressure is fundamental to the teaching herein.

It can be seen from the Fig. that the pressure taught in the present invention is significantly below the range of pressures recognized in the industry as necessary to produce acceptable FR-4 materials. Once a process, such as the FR-4 process, is stabilized around recognized process parameters, there is tremendous hesitation in the industry to vary the process due to the costs of retooling, concern about lower yields, and the time and effort necessary to document the new process, to transfer the process to manufacturing and to retrain manufacturing personnel on the new process. This inertia has compelled the industry to continue to apply FR-4 processing techniques to new materials, such as cyanate esters. The inventor, by breaking with tradition, has found a unique solution to persistent problems that have heretofore impeded industry acceptance of cyanate ester materials.

The lowest commonly accepted pressure previously recognized for laminating an 18"×24" printed circuit board panel was about 156 psi. The minimum pressure limits were considered necessary, e.g. when using FR-4, to avoid having air bubbles that are present in solution in the FR-4 resin produce laminates and multilayer printed circuit boards containing voids. The higher pressures provided a mechanism for compressing the air bubbles and forcing them back into the resin, thus avoiding the formation of such voids in the finished product.

The present invention recognizes that lower pressures may be used with cyanate ester laminates than was previously considered possible, based on industry experience with FR-4. Cyanate ester resins have less sensitivity to void formation than FR-4 at a constant lamination pressure, which allows cyanate ester to be successfully laminated at lower pressure.

The low pressure lamination scheme taught by the present invention offers the first robust process for producing commercially viable multilayer printed circuit boards with cyanate ester materials. In addition to the superior qualities of cyanate ester materials for producing thick multilayer printed circuit boards, particularly those useful for high frequency applications (i.e. cyanate esters have both a lower dielectric constant and lower loss factors), the present invention extends the commercial applicability of cyanate esters.

The solution of the problems previously encountered with cyanate ester materials by the present invention allows the material to find much broader application and therefore provides an attractive alternative to FR-4 and other materials.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

I claim:

1. A process for preventing microcracking and/or delamination in cyanate ester multilayer printed circuit boards, comprising the steps of:
   stacking a cyanate ester core and a cyanate ester prepreg material in alternating layers;
   applying pressure to said stacked materials, wherein said pressure is from about 75 psi up to 150 psi; and
   heating said materials while under pressure to partially cure said materials to about 85% conversion and thereby produce a laminate.

2. The process of claim 1, further comprising the step of:
   post baking said laminate in the absence of pressure to complete the cure of said materials.

3. The process of claim 1, wherein said pressure is about 75 psi.

4. The process of claim 1, wherein said materials are heated to a temperature of about 180° C.

5. The process of claim 2, where said post bake occurs at a temperature of about 220° C.

6. A process for preventing microcracking and/or delamination in multilayer cyanate ester printed circuit boards, comprising the steps of:

stacking at least one cyanate ester core and at least one cyanate ester prepreg material in alternating layers;

applying pressure to said stacked materials, wherein said pressure is from about 75 psi up to 150 psi;

heating said materials while under pressure to partially cure said materials to about 85% conversion and thereby produce a laminate; and post baking said laminate in the absence of pressure to complete the cure of said materials.

7. The process of claim 6, wherein said pressure is about 75 psi.

8. The process of claim 6, wherein said materials are heated to a temperature of about 180° C.

9. The process of claim 6, where said post bake occurs at a temperature of about 220° C.

10. A multilayer cyanate ester printed circuit board made by the process of claim 1.

* * * * *